(12) United States Patent
Asadi et al.

(10) Patent No.: US 11,190,212 B1
(45) Date of Patent: Nov. 30, 2021

(54) DYNAMIC CONTROL OF QUASI-CYCLIC LOW-DENSITY PARITY-CHECK BIT-FLIPPING DECODER

(71) Applicant: SK hynix Inc., Icheon-si (KR)

(72) Inventors: Meysam Asadi, Fremont, CA (US); Aman Bhatia, San Jose, CA (US); Fan Zhang, Fremont, CA (US); Haobo Wang, San Jose, CA (US)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/938,481

(22) Filed: Jul. 24, 2020

(51) Int. Cl.
*H03M 13/11* (2006.01)

(52) U.S. Cl.
CPC ...... *H03M 13/116* (2013.01); *H03M 13/1111* (2013.01); *H03M 13/1137* (2013.01)

(58) Field of Classification Search
CPC .................................................. H03M 13/116
USPC .................. 714/752, 754, 757, 751, 755
See application file for complete search history.

(56) References Cited

U.S. PATENT DOCUMENTS

| | | | |
|---|---|---|---|
| 8,677,225 B1 | 3/2014 | Weiner | |
| 9,114,471 B2 * | 8/2015 | Koprivnak | B23K 9/1012 |
| 9,214,962 B2 * | 12/2015 | Murakami | H03M 13/635 |
| 2013/0297993 A1 * | 11/2013 | Murakami | H03M 13/23 |
| | | | 714/786 |
| 2019/0036548 A1 * | 1/2019 | Hsiao | G06F 11/1012 |
| 2019/0074850 A1 * | 3/2019 | Hsiao | H03M 13/6566 |
| 2019/0158115 A1 | 5/2019 | Kuo | |

* cited by examiner

*Primary Examiner* — Fritz Alphonse
(74) *Attorney, Agent, or Firm* — Perkins Coie LLP

(57) ABSTRACT

Devices, systems, and methods for dynamic control of a quasi-cyclic low-density parity-check (QC-LDPC) bit-flipping decoder are described. An example method includes receiving a noisy codeword based on a transmitted codeword generated from an irregular QC-LDPC code, performing a plurality of decoding iterations on the received noisy codeword, each of the plurality of decoding iterations comprising processing of N circulant matrices, performing, before processing a current circulant matrix in a current M-th iteration of the plurality of decoding iterations, operations that include computing a number of bit flips that have occurred over the processing of N previous circulant matrices, the N previous circulant matrices spanning the current M-th iteration and an (M−1)-th iteration, wherein M and N are positive integers, and wherein M≥2, and updating, based on the number of bit flips, a bit-flipping threshold, and processing, based on the updated bit-flipping threshold, the current circulant matrix.

20 Claims, 8 Drawing Sheets

DYNAMIC CONTROL OF QUASI-CYCLIC LOW-DENSITY PARITY-CHECK BIT-FLIPPING DECODER

TECHNICAL FIELD

This patent document generally relates to non-volatile memory devices, and more specifically, to error correction in non-volatile memory devices.

BACKGROUND

Data integrity is an important feature for any data storage device and data transmission. Use of strong error-correction codes (ECCs) is recommended for various types of data storage devices including NAND flash memory devices.

Solid-state drives (SSDs) use multi-level NAND flash devices for persistent storage. However, multi-level NAND flash devices can be inherently unreliable and generally need to use ECCs to allow dramatic increase in data reliability at the expense of extra storage space for ECC parity bits. There is a demand for more efficient decoding approaches that can provide data protection with improved decoding performance.

SUMMARY

Embodiments of the disclosed technology relate to dynamic control of a quasi-cyclic low-density parity-check (QC-LDPC) bit-flipping decoder that can improve reliability of data stored to and retrieved from a non-volatile memory. This and other features and benefits are achieved at least in-part by computing a number of bit-flips that have occurred over the processing of N previous circulant matrices and updating the bit-flipping threshold based on the number of bit-flips.

In an example aspect, a method for improving a decoding performance of a bit-flipping decoder is described. The method includes receiving a noisy codeword that is based on a transmitted codeword generated from an irregular quasi-cyclic low-density parity-check (QC-LDPC) code, performing a plurality of decoding iterations on the received noisy codeword, each of the plurality of decoding iterations comprising processing of N circulant matrices, performing, before processing a current circulant matrix in a current M-th iteration of the plurality of decoding iterations, operations that include computing a number of bit flips that have occurred over the processing of N previous circulant matrices, the N previous circulant matrices spanning the current M-th iteration and an (M−1)-th iteration, wherein M and N are positive integers, and wherein M≥2, and updating, based on the number of bit flips, a bit-flipping threshold, and processing, based on the updated bit-flipping threshold, the current circulant matrix.

In yet another example aspect, the above-described method may be implemented by a video encoder apparatus or a video decoder apparatus that comprises a processor.

In yet another example aspect, these methods may be embodied in the form of processor-executable instructions and stored on a computer-readable program medium.

The subject matter described in this patent document can be implemented in specific ways that provide one or more of the following features.

DETAILED DESCRIPTION

Solid state drives (SSDs) are a new generation of storage device used in computers. SSDs replace traditional mechanical hard disks by using flash-based memory, which is significantly faster. SSDs speed up computers significantly due to their low read-access times and fast throughputs. SSDs can be configured to use irregular quasi-cyclic LDPC (QC-LDPC) codes to correct any bit-errors in pages read from NAND media. QC-LDPC codes are used to ensure data integrity in storage systems that use the new generation of NAND flash memories. Iterative decoders for LDPC code in general, and irregular QC-LDPC codes in particular, have wide range of complexities. The two primary types of decoders are the low-complexity bit-flipping (BF) decoder with low error-correction capability and the high-complexity min-sum (MS) decoder with high error-correction capability.

For typical SSD applications, most page reads (more than 99%) are by the bit-flipping decoder. Thus, designing hardware for fast and efficient bit-flipping (BF) decoder, which exhibits improved convergence properties, is critical especially in mobile and client SSD applications because of their strict power constraints and throughput requirements.

This document first overviews an example of a non-volatile memory system in which bit-flipping decoder can be implemented to decode irregular QC-LDPC codes, and then describes methods, systems and devices to improve the decoding performance of the bit-flipping decoder by, for example, computing the number of bit-flips over a previous number of circulant-columns in the irregular QC-LDPC code and subsequently updating the bit-flipping threshold.

FIGS. 1-6 overview a non-volatile memory system (e.g., flash-based memory or NAND flash) in which embodiments of the disclosed technology may be implemented.

Figure 1:
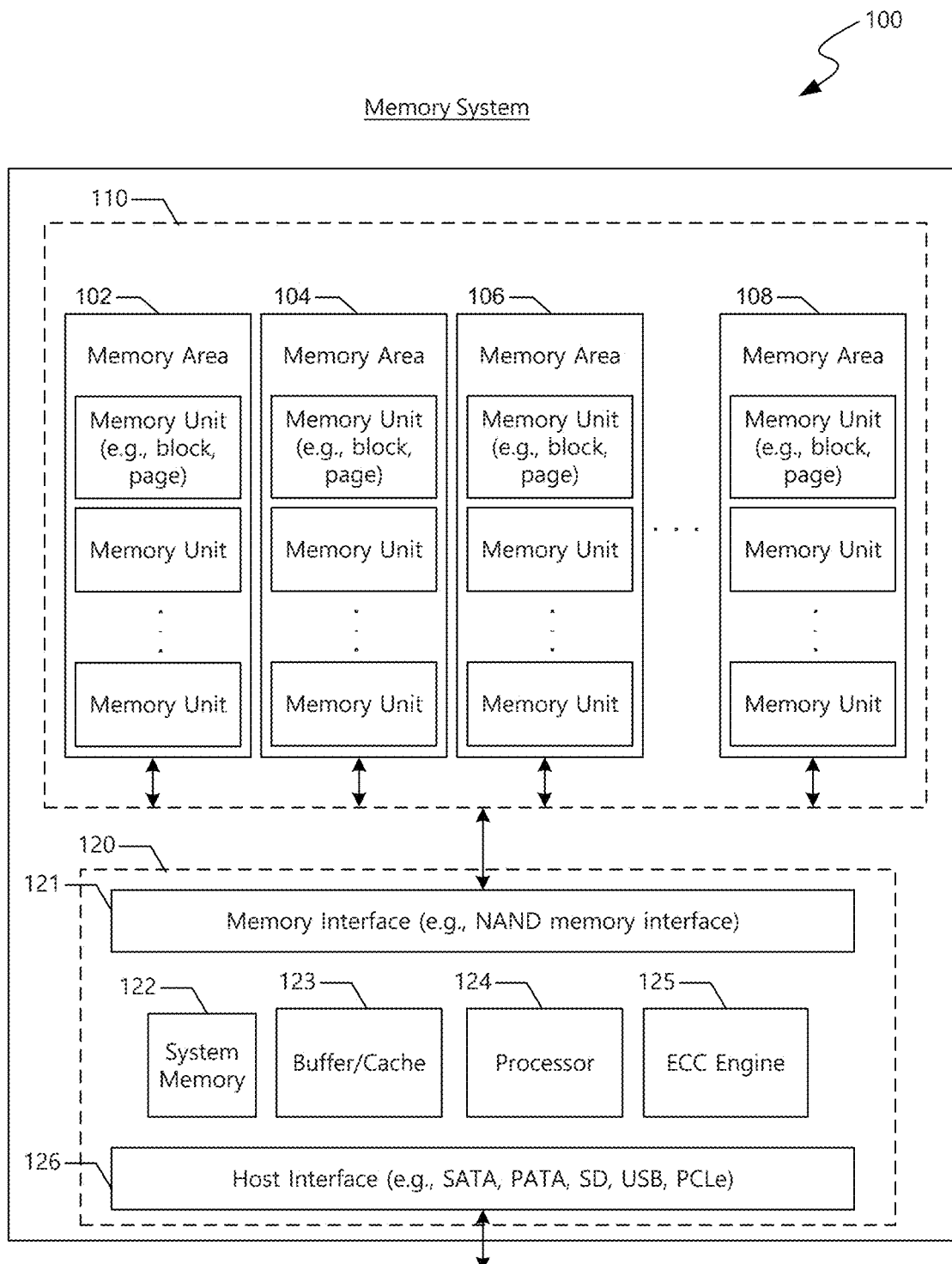
FIG. 1 illustrates an example of a memory system.

FIG. 1 is a block diagram of an example of a memory system 100 implemented based on some embodiments of the disclosed technology. The memory system 100 includes a memory module 110 that can be used to store information for use by other electronic devices or systems. The memory system 100 can be incorporated (e.g., located on a circuit board) in other electronic devices and systems. Alternatively, the memory system 100 can be implemented as an external storage device such as a USB flash drive and a solid-state drive (SSD).

The memory module 110 included in the memory system 100 can include memory areas (e.g., memory arrays) 102, 104, 106, and 108. Each of the memory areas 102, 104, 106, and 108 can be included in a single memory die or in multiple memory dice. The memory die can be included in an integrated circuit (IC) chip.

Each of the memory areas 102, 104, 106, and 108 includes a plurality of memory cells. Read, program, or erase operations can be performed on a memory unit basis. Thus, each memory unit can include a predetermined number of memory cells. The memory cells in a memory area 102, 104, 106, or 108 can be included in a single memory die or in multiple memory dice.

The memory cells in each of memory areas 102, 104, 106, and 108 can be arranged in rows and columns in the memory units. Each of the memory units can be a physical unit. For example, a group of a plurality of memory cells can form a memory unit. Each of the memory units can also be a logical unit. For example, the memory unit can be a block or a page that can be identified by a unique address such as a block address or a page address, respectively. For another example, wherein the memory areas 102, 104, 106, and 108 can include computer memories that include memory banks as a logical unit of data storage, the memory unit can be a bank that can be identified by a bank address. During a read or write operation, the unique address associated with a particular memory unit can be used to access that particular memory unit. Based on the unique address, information can be written to or retrieved from one or more memory cells in that particular memory unit.

The memory cells in the memory areas 102, 104, 106, and 108 can include non-volatile memory cells. Examples of non-volatile memory cells include flash memory cells, phase change random-access memory (PRAM) cells, magnetoresistive random-access memory (MRAM) cells, or other types of non-volatile memory cells. In an example implementation where the memory cells are configured as NAND flash memory cells, the read or write operation can be performed on a page basis. However, an erase operation in a NAND flash memory is performed on a block basis.

Each of the non-volatile memory cells can be configured as a single-level cell (SLC) or multiple-level memory cell. A single-level cell can store one bit of information per cell. A multiple-level memory cell can store more than one bit of information per cell. For example, each of the memory cells in the memory areas 102, 104, 106, and 108 can be configured as a multi-level cell (MLC) to store two bits of information per cell, a triple-level cell (TLC) to store three bits of information per cell, or a quad-level cells (QLC) to store four bits of information per cell. In another example, each of the memory cells in memory area 102, 104, 106 and 108 can be configured to store at least one bit of information (e.g., one bit of information or multiple bits of information), and each of the memory cells in memory area 102, 104, 106 and 108 can be configured to store more than one bit of information.

As shown in FIG. 1, the memory system 100 includes a controller module 120. The controller module 120 includes a memory interface 121 to communicate with the memory module 110, a host interface 126 to communicate with a host (not shown), a processor 124 to execute firmware-level code, and caches and memories 123 and 122, respectively to temporarily or persistently store executable firmware/instructions and associated information. In some implementations, the controller unit 120 can include an error correction engine 125 to perform error correction operation on information stored in the memory module 110. Error correction engine 125 can be configured to detect/correct single bit error or multiple bit errors. In another implementation, error correction engine 125 can be located in the memory module 110.

The host can be a device or a system that includes one or more processors that operate to retrieve data from the memory system 100 or store or write data into the memory system 100. In some implementations, examples of the host can include a personal computer (PC), a portable digital device, a digital camera, a digital multimedia player, a television, and a wireless communication device.

In some implementations, the controller module 120 can also include a host interface 126 to communicate with the host. Host interface 126 can include components that comply with at least one of host interface specifications, including but not limited to, Serial Advanced Technology Attachment (SATA), Serial Attached Small Computer System Interface (SAS) specification, Peripheral Component Interconnect Express (PCIe).

Figure 2:
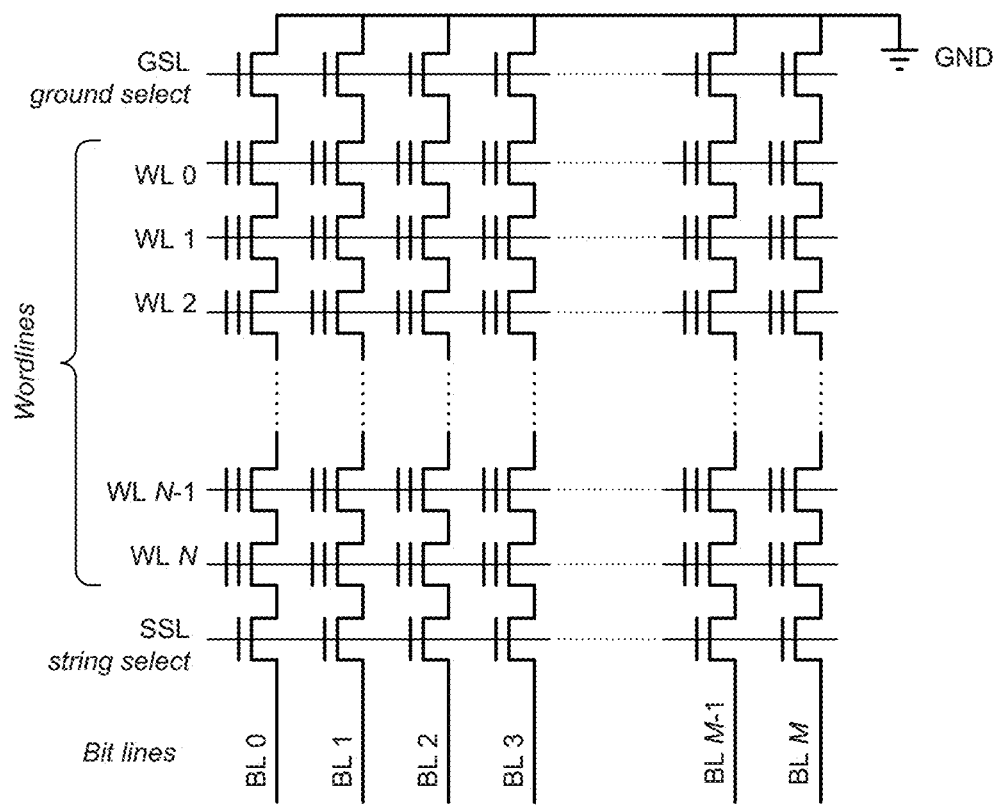
FIG. 2 is an illustration of an example non-volatile memory device.

FIG. 2 illustrates an example of a memory cell array implemented based on some embodiments of the disclosed technology.

In some implementations, the memory cell array can include NAND flash memory array that is partitioned into many blocks, and each block contains a certain number of pages. Each block includes a plurality of memory cell strings, and each memory cell string includes a plurality of memory cells.

In some implementations where the memory cell array is NAND flash memory array, read and write (program) operations are performed on a page basis, and erase operations are performed on a block basis. All the memory cells within the same block must be erased at the same time before performing a program operation on any page included in the block. In an implementation, NAND flash memories may use an even/odd bit-line structure. In another implementation, NAND flash memories may use an all-bit-line structure. In the even/odd bit-line structure, even and odd bit-lines are interleaved along each word-line and are alternatively accessed so that each pair of even and odd bit-lines can share peripheral circuits such as page buffers. In all-bit-line structure, all the bit-lines are accessed at the same time.

Figure 3:
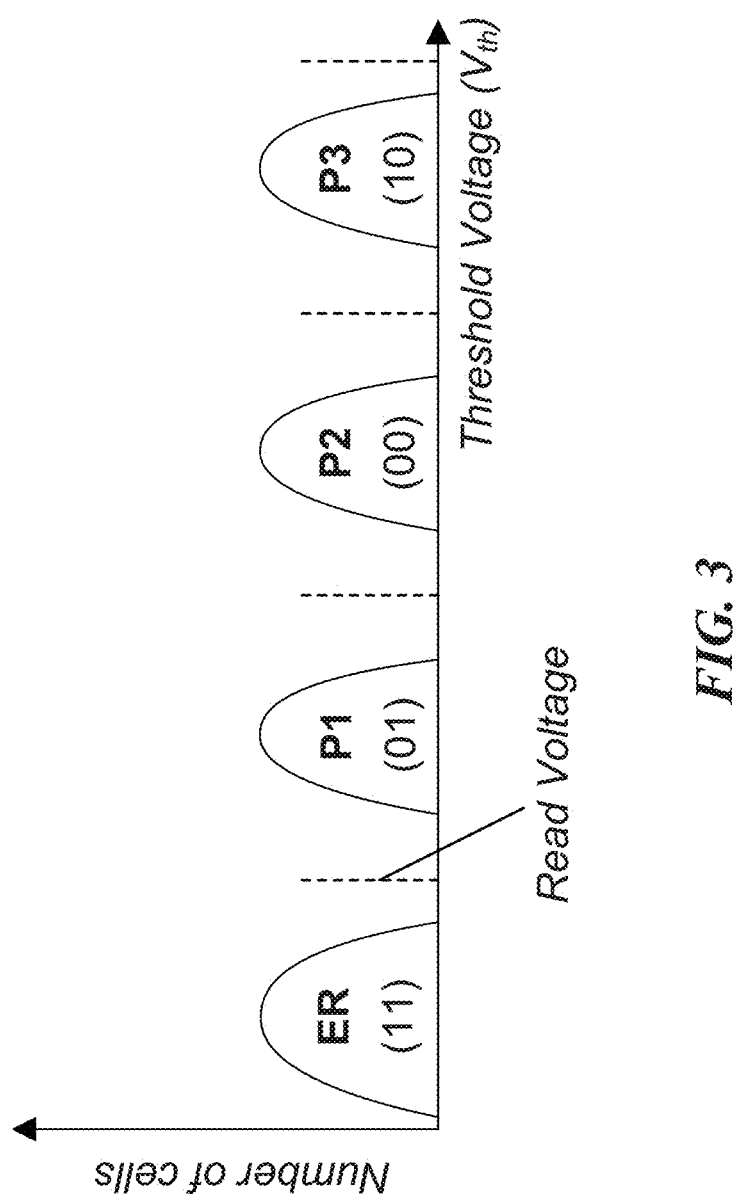
FIG. 3 is an example diagram illustrating the cell voltage level distribution ($V_{th}$) of a non-volatile memory device.

FIG. 3 illustrates an example of threshold voltage distribution curves in a multi-level cell device, wherein the number of cells for each program/erase state is plotted as a function of the threshold voltage. As illustrated therein, the threshold voltage distribution curves include the erase state (denoted "ER" and corresponding to "11") with the lowest threshold voltage, and three program states (denoted "P1", "P2" and "P3" corresponding to "01", "00" and "10", respectively) with read voltages in between the states (denoted by the dotted lines). In some embodiments, each of the threshold voltage distributions of program/erase states has a finite width because of differences in material properties across the memory array.

Although FIG. 3 shows a multi-level cell device by way of example, each of the memory cells can be configured to store any number of bits per cell. In some implementations, each of the memory cells can be configured as a single-level cell (SLC) to store one bit of information per cell, or as a triple-level cell (TLC) to store three bits of information per cell, or as a quad-level cells (QLC) to store four bits of information per cell.

In writing more than one data bit in a memory cell, fine placement of the threshold voltage levels of memory cells is needed because of the reduced distance between adjacent distributions. This is achieved by using incremental step pulse program (ISPP), i.e., memory cells on the same word-line are repeatedly programmed using a program-and-verify approach with a stair case program voltage applied to word-lines. Each programmed state associates with a verify voltage that is used in verify operations and sets the target position of each threshold voltage distribution window.

Read errors can be caused by distorted or overlapped threshold voltage distribution. An ideal memory cell threshold voltage distribution can be significantly distorted or overlapped due to, e.g., program and erase (P/E) cycle, cell-to-cell interference, and data retention errors, which will be discussed in the following, and such read errors may be managed in most situations by using error correction codes (ECC).

Figure 4:
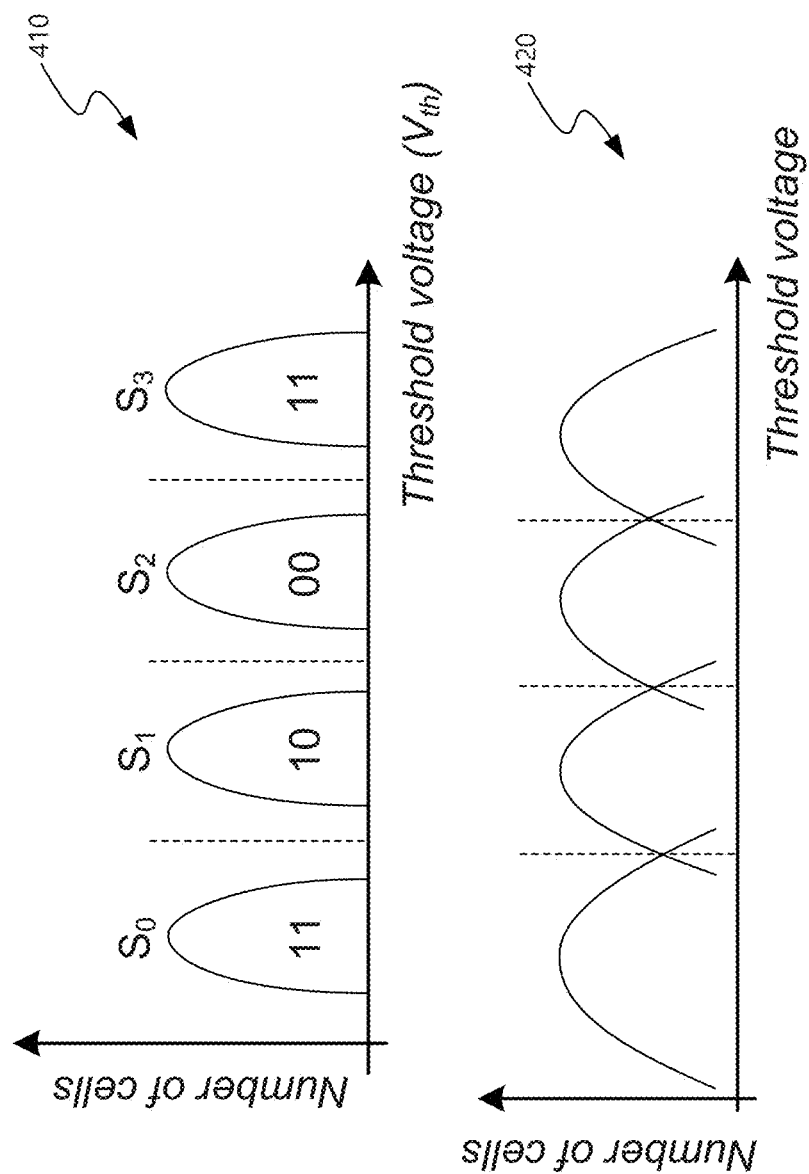
FIG. 4 is another example diagram illustrating the cell voltage level distribution ($V_{th}$) of a non-volatile memory device.

FIG. 4 illustrates an example of ideal threshold voltage distribution curves 410 and an example of distorted threshold voltage distribution curves 420. The vertical axis indicates the number of memory cells that has a particular threshold voltage represented on the horizontal axis.

For n-bit multi-level cell NAND flash memory, the threshold voltage of each cell can be programmed to $2^n$ possible values. In an ideal multi-level cell NAND flash memory, each value corresponds to a non-overlapping threshold voltage window.

Flash memory P/E cycling causes damage to a tunnel oxide of floating gate of a charge trapping layer of cell transistors, which results in threshold voltage shift and thus gradually degrades memory device noise margin. As P/E cycles increase, the margin between neighboring distributions of different programmed states decreases and eventually the distributions start overlapping. The data bit stored in a memory cell with a threshold voltage programmed in the overlapping range of the neighboring distributions may be misjudged as a value other than the original targeted value.

Figure 5:
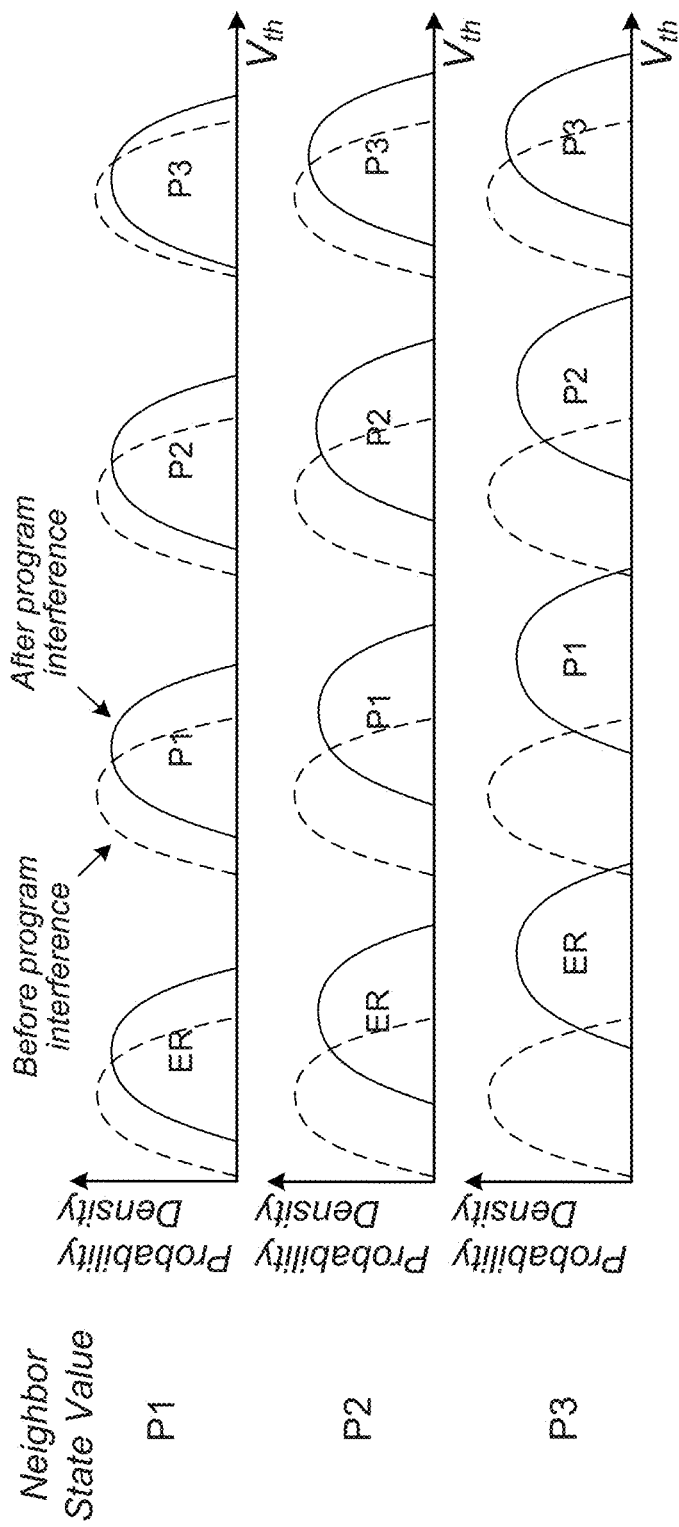
FIG. 5 is an example diagram illustrating the cell voltage level distribution ($V_{th}$) of a non-volatile memory device before and after program interference.

FIG. 5 illustrates an example of a cell-to-cell interference in NAND flash memory. The cell-to-cell interference can also cause threshold voltages of flash cells to be distorted. The threshold voltage shift of one memory cell transistor can influence the threshold voltage of its adjacent memory cell transistor through parasitic capacitance-coupling effect between the interfering cell and the victim cell. The amount of the cell-to-cell interference may be affected by NAND flash memory bit-line structure. In the even/odd bit-line structure, memory cells on one word-line are alternatively connected to even and odd bit-lines and even cells are programmed ahead of odd cells in the same word-line. Therefore, even cells and odd cells experience different amount of cell-to-cell interference. Cells in all-bit-line structure suffer less cell-to-cell interference than even cells in the even/odd bit-line structure, and the all-bit-line structure can effectively support high-speed current sensing to improve the memory read and verify speed.

The dotted lines in FIG. 5 denote the nominal distributions of P/E states (before program interference) of the cells under consideration, and the "neighbor state value" denotes the value that the neighboring state has been programmed to. As illustrated in FIG. 5, if the neighboring state is programmed to P1, the threshold voltage distributions of the cells under consideration shift by a specific amount. However, if the neighboring state is programmed to P2, which has a higher threshold voltage than P1, that results in a greater shift compared to the neighboring state being P1. Similarly, the shift in the threshold voltage distributions is greatest when the neighboring state is programmed to P3.

Figure 6:
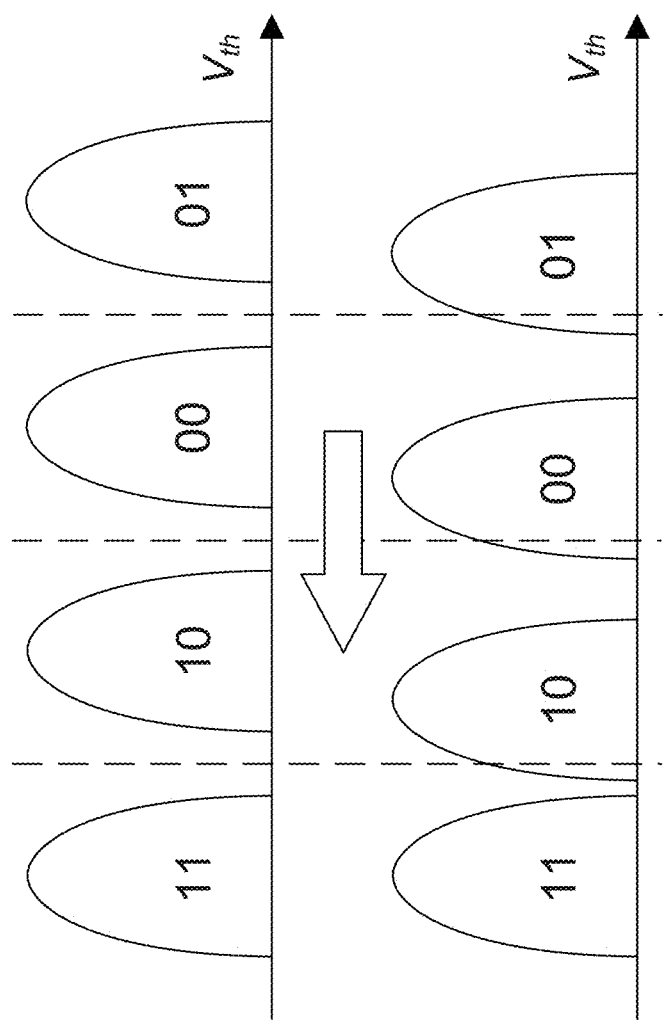
FIG. 6 is an example diagram illustrating the cell voltage level distribution ($V_{th}$) of a non-volatile memory device as a function of the reference voltage.

FIG. 6 illustrates an example of a retention error in NAND flash memory by comparing normal threshold-voltage distribution and shifted threshold-voltage distribution. The data stored in NAND flash memories tend to get corrupted over time and this is known as a data retention error. Retention errors are caused by loss of charge stored in the floating gate or charge trap layer of the cell transistor. Due to wear of the floating gate or charge trap layer, memory cells with more program erase cycles are more likely to experience retention errors. In the example of FIG. 6, comparing the top row of voltage distributions (before corruption) and the bottom row of distributions (contaminated by retention error) reveals a shift to the left.

According to some embodiments of the disclosed technology, methods, systems, and devices improve a decoding performance of bit-flipping decoder implementations for QC-LDPC codes, which are used in non-volatile memory devices (e.g., as described in FIGS. 1-6) that constitute SSDs. In an example, the bit-flipping threshold is updated based on computing the number of bit-flips over a previous number of circulant-columns in the QC-LDPC code.

Quasi-cyclic codes are defined by the property that, for an integer $n_0$, every cyclic shift of a codeword by $n_0$ places is also a codeword. For a systematic ($n=mn_0$, $k=mk_0$) quasi-cyclic linear code, the corresponding parity check matrix H is represented as:

$$H = \begin{bmatrix} & C'_{1,1} & C'_{1,2} & \cdots & C'_{1,k_0} \\ & C'_{2,1} & C'_{2,2} & \cdots & C'_{2,k_0} \\ I_{n-k} & C'_{3,1} & C'_{3,2} & & C'_{3,k_0} \\ & \vdots & \vdots & & \vdots \\ & C'_{n_0-k_0,1} & C'_{n_0-k_0,2} & \cdots & C'_{n_0-k_0,k_0} \end{bmatrix}$$

Herein, n denotes the length of the code, k denotes the rank of the code (which corresponds to the number of codewords in its basis and the number of rows in its generating matrix), m denotes the size of the circulant matrix, $k_0$ is an integer that is based on the values of n, m and $n_0$, $I_{n-k}$ represents an (n−k)×(n−k) identity matrix, and each $C'_{i,j}$ is a m×m circulant matrix (with size circulantSize or circSize) of the following form:

$$C'_{i,j} = \begin{bmatrix} c_0 & c_1 & c_2 & \cdots & c_{m-1} \\ c_{m-1} & c_0 & c_1 & \cdots & c_{m-2} \\ c_{m-1} & c_{m-1} & c_0 & \cdots & c_{m-3} \\ \vdots & \vdots & \vdots & & \vdots \\ c_1 & c_2 & c_3 & \cdots & c_0 \end{bmatrix}.$$

In contrast to a quasi-cyclic code in which all columns have an equal column weight (e.g., each column has the same number of 1's), an irregular quasi-cyclic code has at least two columns with different numbers of 1's, i.e., columns with different weights.

Both regular and irregular LDPC codes can be represented using a Tanner graph, which includes a set of nodes (or vertices) and a set of edges connecting the nodes. The Tanner graph corresponding to an M×N parity-check matrix contains M variable nodes (or bit nodes) and N check nodes (or check sum nodes), and provides a graphical representation of the parity-check matrix to which is corresponds. The performance and decoding of an LDPC code (regular or irregular) are based on the row-weights and column-weights of the parity-check matrix, or equivalently, the cycles in the Tanner graph representation.

In an example, at each iteration of the bit-flipping decoder for every variable node (VN), the number of unsatisfied check nodes are compared with a threshold. The hard decision estimate of the bit is flipped if the number of unsatisfied check nodes is larger than the threshold. In some embodiments, bit-flipping algorithms configured to operate in (i) an aggressive mode, wherein the threshold is selected to be small value, and as a result, a greater number of bits are flipped, and (ii) a conservative mode, wherein the threshold is selected to be large value, and as a result, a lower number of bits are flipped. In the aggressive mode, because a greater number of bits are flipped, the likelihood of flipping correct bits to incorrect values increases. Thus, a bit-flipping decoder is more likely to operate in the conservative mode, which results in the decoding becoming very slow and inefficient. Selecting the correct strategy for the bit-flipping decoder is essential for optimal decoding performance. However, the bit-flipping decoder does not know which strategy will works better at each moment of the decoder process.

According to some embodiments, different strategies can be used to select an appropriate threshold for a bit-flipping decoder. In an example, the threshold can be configured to be a function of various parameters of the bit-flipping decoder (e.g., degree, iteration index, current checksum, and/or number of bits flipped in previous iteration). Among these parameters, the number of bits flipped in previous iteration is indicative of the operating mode of the bit-flipping decoder at each decoding iteration, and provides feedback information to the bit-flipping decoder to become aggressive (conservative) if it was too conservative (aggressive) in the previous iteration.

In some embodiments, the number of bits flipped in the previous iteration can be used to determine the operation of the bit-flipping decoder at the beginning of each iteration. However, this approach typically results in the bit-flipping decoder remaining in the selected operating mode for the entire iteration, which may result in sub-optimal decoding performance is certain cases. Since one of the advantages of using a bit-flipping decoder is its fast convergence rate when decoding codewords with low bit-error rates, using the number of bits flipped in the previous iteration slows down the operation of the bit-flipping decoder.

In some embodiments, the operating mode of the bit-flipping decoder can be based on a window flips parameter, which advantageously enables the operating mode to be changed at any time during the iteration. Let $n_{circ}$ denote the number of circulants. Rather than using the number of bit flips in the previous iteration, the bit-flipping decoder uses the number of bit flips in $n_{circ}$ previous processed circulants, which may not necessarily be in the same iteration.

Let $n_j^{(i)}$ be the number of flipped bits in a j-th circulant at an i-th decoding iteration. At the i-th iteration before processing the j-th circulant, the window flips parameter, denoted by $n_w^{(i)}(j)$, is determined as:

$$n_w^{(i)}(j) = \sum_{k=1}^{j-1} n_k^{(i)} + \sum_{k=j}^{n_{circ}} n_k^{(i-1)} \forall i \geq 2$$

Figure 7:
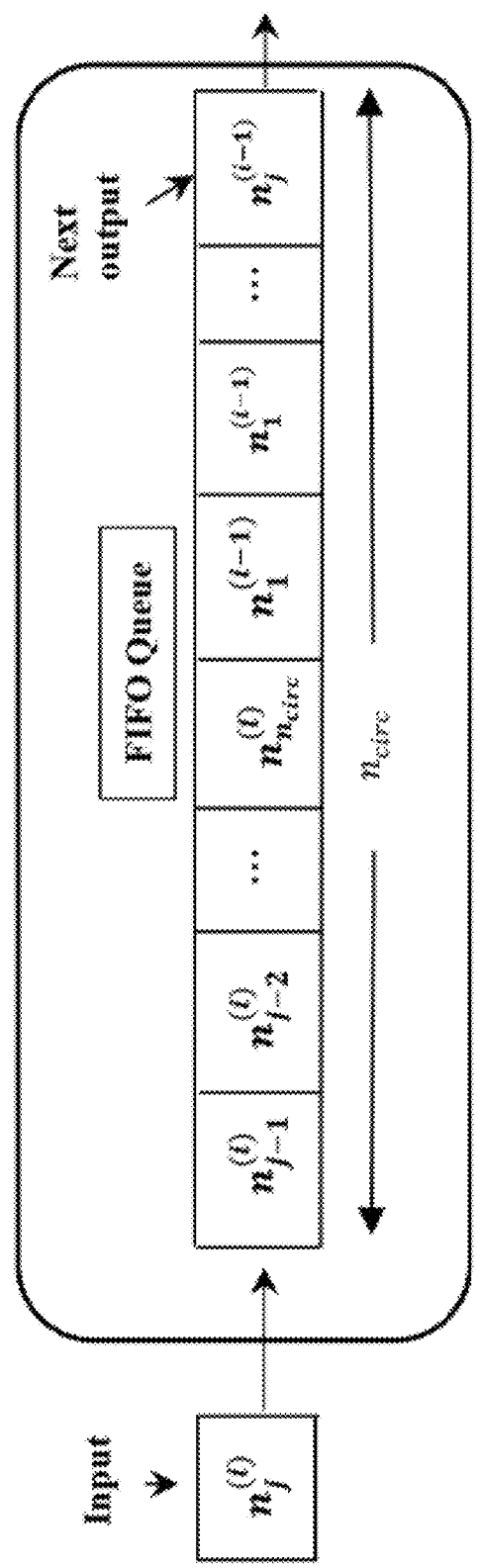
FIG. 7 illustrates an example of a first-in first-out (FIFO) queue used to compute the number of bit-flips in a window.

FIG. 7 illustrates an efficient way to compute $n_w^{(i)}(j)$ using a first-in first-out (FIFO) queue of depth $n_{circ}$. As illustrated therein, upon processing the j-th circulant at the i-th iteration, $n_j^{(i)}$ is added to queue, and $n_w^{(i)}(j+1)$ is determined as:

$$n_w^{(i)}(j+1) = n_w^{(i)}(j) - n_j^{(i-1)} + n_j^{(i)} \quad (1)$$

Herein, $n_j^{(i-1)}$ is the output of the FIFO queue. Thus, a total of ($n_{circ}+1$) integers ($n_{circ}$ values in the queue along with $n_w^{(i)}(j)$) need to be stored to efficiently compute the $n_w^{(i)}(j+1)$.

According to some embodiments, an iterative decoding method that computes the window flips parameters to improve decoding performance is described. Assume i ($0 \leq i \leq i_{max}$) represents the iteration index, $d_j^{(i)}$ denotes the decision of variable node j of the i-th iteration, and $d^{(i)} = [d_0^{(i)}, d_1^{(i)}, \ldots, d_{N-1}^{(i)}]$. $s^{(i)} = [d_0^{(i)}, d_1^{(i)}, \ldots, d_{N-1}^{(i)}]H^T$, wherein s is the computed syndrome and H is the parity check matrix of the QC-LDPC code. It is further assumed that $d^{(-1)} = [d_0^{(-1)}, d_1^{(-1)}, \ldots, d_{N-1}^{(-1)}] = y$, and thus $s^{(+1)} = yH^T$.

In some embodiments, the iterative decoding method comprises:

Operation 0: Set i=0, calculate $s^{(-1)}$ and go to Operation 1;

Operation 1: i=i+1, if a maximum number of iterations is reached, stop decoding; otherwise, go to Operation 2;

Operation 2: if s=0, stop decoding; otherwise, go to Operation 3;

Operation 3: For $1 \leq j \leq n_{circ}$,

Concurrently update flipping energy E(j) for all VNs in the j-th circulant

If i≥2, update the flipping threshold T using the window flips parameter $n_w^{(i)}(j)$; otherwise ignore the window flips parameter and threshold T Flip the bits in j-th circulant for which E(j)>T Add $n_j^{(i)}$ to the FIFO queue, and compute $n_w^{(i)}(j+1)$ using Equation (1)

Compute and update the syndrome, s

Go to Operation 1

The method described above incorporates the efficient computation of the window flips parameter into an iterative decoding algorithm for the bit-flipping decoder. Computing the window flips parameter based on the most recent $n_{circ}$ previously processed circulants enables the operating mode of the bit-flipping decoder to be adjusted before the processing of each circulant-column. In some embodiments, the aggressiveness of the operation of the bit-flipping decoder can be configured to evolve based on the varying window flips parameter. In other embodiments, a time-averaged version of the window flips parameter can be used to adjust the operating mode of the bit-flipping decoder. In yet other embodiments, the number of bit flips in the $n_{circ}$ previously processed circulants can be weighted when determining the window flips parameter. In an example, an exponential weight may be used to rely on more recent previously processed circulants and rely less on the oldest previously processed circulants.

Figure 8:
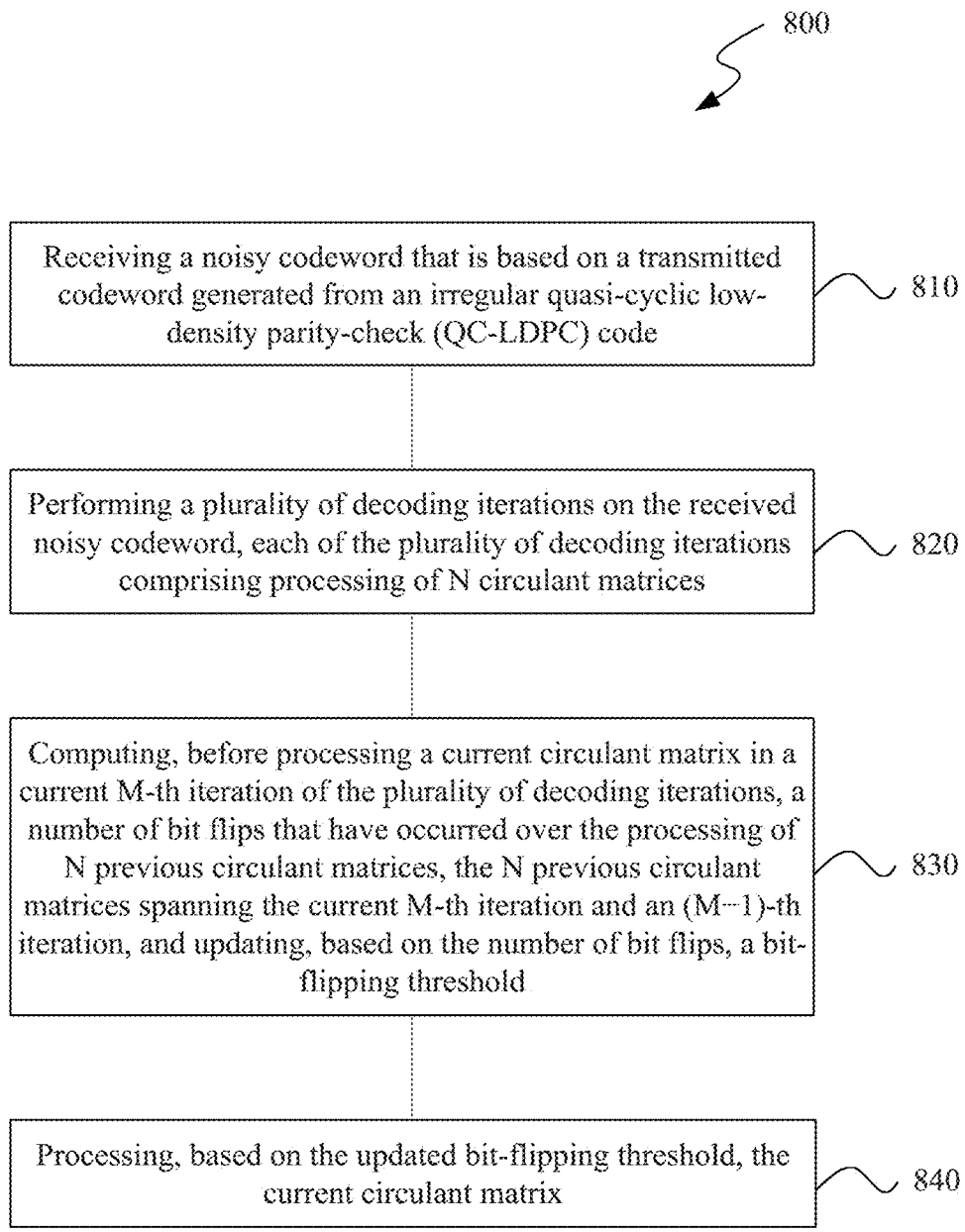
FIG. 8 illustrates a flowchart of an example method for improving the convergence of a bit-flipping decoder in a non-volatile memory using out-of-order processing.

FIG. 8 illustrates a flowchart of a method for improving the decoding performance of a bit-flipping decoder in a non-volatile memory using out-of-order processing. The method 800 includes, at operation 810, receiving a noisy codeword that is based on a transmitted codeword generated from an irregular quasi-cyclic low-density parity-check (QC-LDPC) code.

The method 800 includes, at operation 820, performing a plurality of decoding iterations on the received noisy codeword, each of the plurality of decoding iterations comprising processing of N circulant matrices.

The method 800 includes, at operation 830, computing, before processing a current circulant matrix in a current M-th iteration of the plurality of decoding iterations, a number of bit flips that have occurred over the processing of N previous circulant matrices, the N previous circulant matrices spanning the current M-th iteration and an (M−1)- th iteration, and updating, based on the number of bit flips, a bit-flipping threshold, wherein M and N are positive integers, and wherein M≥2.

The method 800 includes, at operation 840, processing, based on the updated bit-flipping threshold, the current circulant matrix.

In some embodiments, wherein the method 800 further includes the operations of computing a syndrome, and refraining from performing a subsequent iteration of the bit-flipping decoder upon a determination that a maximum number of iterations has been performed or that the syndrome is equal to zero.

In some embodiments, wherein each of the plurality of decoding iterations comprises passing one or more messages between a plurality of variable nodes and a plurality of check nodes that represent a parity check matrix of the irregular QC-LDPC code.

In some embodiments, wherein the method 800 further includes the operation of concurrently computing, for each of the plurality of decoding iterations, a flipping energy for each of the plurality of variable nodes in the current circulant matrix.

In some embodiments, wherein the number of bit flips in an i-th iteration and prior to processing a j-th circulant matrix (denoted $n_w^{(i)}(j)$) is determined as:

$$n_w^{(i)}(j) = \sum_{k=1}^{j-1} n_k^{(i)} + \sum_{k=j}^{N} n_k^{(i-1)},$$

Herein, $n_k^{(i)}$ is the number of bit flips in a k-th circulant matrix in the i-th iteration and $n_k^{(i-1)}$ is the number of bit flips in the k-th circulant matrix in an (i−1)-th iteration, wherein i, j and k are positive integers, and wherein i≥2.

In some embodiments, computing the number of bit flips in an i-th iteration and prior to processing a (j+1)-th circulant matrix (denoted $n_w^{(i)}(j+1)$) uses a first-in first-out (FIFO) queue of depth N.

In some embodiments, $n_w^{(i)}(j+1)$ is determined as:

$$n_w^{(i)}(j+1) = n_w^{(i)}(j) - n_j^{(i-1)} + n_j^{(i)}$$

Herein, $n_j^{(i)}$ is the number of bit flips in a j-th circulant matrix in the i-th iteration and $n_j^{(i-1)}$ is the number of bit flips in the j-th circulant matrix in an (i−1)-th iteration, wherein $n_w^{(i)}(j)$ is the number of bit flips in the i-th iteration prior to processing the j-th circulant matrix, and wherein i and j are positive integers.

Implementations of the subject matter and the functional operations described in this patent document can be implemented in various systems, digital electronic circuitry, or in computer software, firmware, or hardware, including the structures disclosed in this specification and their structural equivalents, or in combinations of one or more of them. Implementations of the subject matter described in this specification can be implemented as one or more computer program products, i.e., one or more modules of computer program instructions encoded on a tangible and non-transitory computer readable medium for execution by, or to control the operation of, data processing apparatus. The computer readable medium can be a machine-readable storage device, a machine-readable storage substrate, a memory device, a composition of matter effecting a machine-readable propagated signal, or a combination of one or more of them. The term "data processing unit" or "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data include all forms of non-volatile memory, media and memory devices, including by way of example semiconductor memory devices, e.g., EPROM, EEPROM, and flash memory devices. The processor and the memory can be supplemented by, or incorporated in, special purpose logic circuitry.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

What is claimed is:

1. A method for improving a decoding performance of a bit-flipping decoder associated with a non-volatile memory, comprising:
  receiving, by a controller unit of the non-volatile memory, a noisy codeword that is based on a transmitted codeword generated from an irregular quasi-cyclic low-density parity-check (QC-LDPC) code;
  performing, by the bit-flipping decoder, a plurality of decoding iterations on the received noisy codeword, each of the plurality of decoding iterations comprising processing of N circulant matrices;
  performing, before processing a current circulant matrix in a current M-th iteration of the plurality of decoding iterations, operations that include:
    computing a number of bit flips ($n_w$) that have occurred over the processing of N previous circulant matrices, the N previous circulant matrices spanning the current M-th iteration and an (M−1)-th iteration, wherein M and N are positive integers, and wherein M≥2, and
    updating, based on the number of bit flips, a bit-flipping threshold; and
  processing, based on the updated bit-flipping threshold, the current circulant matrix.

2. The method of claim 1, further comprising:
  computing a syndrome; and
  refraining from performing a subsequent iteration of the bit-flipping decoder upon a determination that a maximum number of iterations has been performed or that the syndrome is equal to zero.

3. The method of claim 1, wherein each of the plurality of decoding iterations comprises passing one or more messages between a plurality of variable nodes and a plurality of check nodes that represent a parity check matrix of the irregular QC-LDPC code.

4. The method of claim 3, further comprising:
  concurrently computing, for each of the plurality of decoding iterations, a flipping energy for each of the plurality of variable nodes in the current circulant matrix.

5. The method of claim 1, wherein the number of bit flips in an i-th iteration and prior to processing a j-th circulant matrix (denoted $n_w^{(i)}(j)$) is determined as:

$$n_w^{(i)}(j) = \sum_{k=1}^{j-1} n_k^{(i)} + \sum_{k=j}^{N} n_k^{(i-1)},$$

wherein $n_k^{(i)}$ is the number of bit flips in a k-th circulant matrix in the i-th iteration and $n_k^{(i-1)}$ is the number of bit flips in the k-th circulant matrix in an (i−1)-th iteration, wherein i, j and k are positive integers, and wherein i≥2.

6. The method of claim 1, wherein computing the number of bit flips in an i-th iteration and prior to processing a (j+1)-th circulant matrix (denoted $n_w^{(i)}(j+1)$) uses a first-in first-out (FIFO) queue of depth N.

7. The method of claim 6, wherein $n_w^{(i)}(j+1)$ is determined as:

$$n_w^{(i)}(j+1) = n_w^{(i)}(j) - n_j^{(i-1)} + n_j^{(i)}$$

wherein $n_j^{(i)}$ is the number of bit flips in a j-th circulant matrix in the i-th iteration and $n_j^{(i-1)}$ is the number of bit flips in the j-th circulant matrix in an (i−1)-th iteration, wherein $n_w^{(i)}(j)$ is the number of bit flips in the i-th iteration prior to processing the j-th circulant matrix, and wherein i and j are positive integers.

8. A system for improving a decoding performance of a bit-flipping decoder associated with a non-volatile memory, comprising:
  a processor and a memory including instructions stored thereupon, wherein the instructions upon execution by the processor cause the processor to:
    receive a noisy codeword that is based on a transmitted codeword generated from an irregular quasi-cyclic low-density parity-check (QC-LDPC) code;
    perform a plurality of decoding iterations on the received noisy codeword, each of the plurality of decoding iterations comprising processing of N circulant matrices;
    before processing a current circulant matrix in a current M-th iteration of the plurality of decoding iterations:
      compute a number of bit flips ($n_w$) that have occurred over the processing of N previous circulant matrices, the N previous circulant matrices spanning the current M-th iteration and an (M−1)-th iteration, wherein M and N are positive integers, and wherein M≥2, and
      update, based on the number of bit flips, a bit-flipping threshold; and
    process, based on the updated bit-flipping threshold, the current circulant matrix.

9. The system of claim 8, wherein the instructions upon execution by the processor configure the processor to:
  compute a syndrome; and
  refrain from performing a subsequent iteration of the bit-flipping decoder upon a determination that a maximum number of iterations has been performed or that the syndrome is equal to zero.

10. The system of claim 8, wherein each of the plurality of decoding iterations comprises passing one or more messages between a plurality of variable nodes and a plurality of check nodes that represent a parity check matrix of the irregular QC-LDPC code.

11. The system of claim 10, wherein the instructions upon execution by the processor cause the processor to:
  concurrently compute, for each of the plurality of decoding iterations, a flipping energy for each of the plurality of variable nodes in the current circulant matrix.

12. The system of claim 8, wherein the number of bit flips in an i-th iteration and prior to processing a j-th circulant matrix (denoted $n_w^{(i)}(j)$) is determined as:

$$n_w^{(i)}(j) = \sum_{k=1}^{j-1} n_k^{(i)} + \sum_{k=j}^{N} n_k^{(i-1)},$$

wherein $n_k^{(i)}$ is the number of bit flips in a k-th circulant matrix in the i-th iteration and $n_k^{(i-1)}$ is the number of bit flips in the k-th circulant matrix in an (i−1)-th iteration, wherein i, j and k are positive integers, and wherein i≥2.

13. The system of claim 8, wherein computing the number of bit flips in an i-th iteration and prior to processing a (j+1)-th circulant matrix (denoted $n_w^{(i)}(j+1)$) uses a first-in first-out (FIFO) queue of depth N.

14. The system of claim 13, wherein $n_w^{(i)}(j+1)$ is determined as:

$$n_w^{(i)}(j+1) = n_w^{(i)}(j) - n_j^{(i-1)} + n_j^{(i)}$$

wherein $n_j^{(i)}$ is the number of bit flips in a j-th circulant matrix in the i-th iteration and $n_j^{(i-1)}$ is the number of bit flips in the j-th circulant matrix in an (i−1)-th iteration, wherein $n_w^{(i)}(j)$ is the number of bit flips in the i-th iteration prior to processing the j-th circulant matrix, and wherein i and j are positive integers.

15. A non-transitory computer-readable storage medium having instructions stored thereupon for improving a decoding performance of a bit-flipping decoder associated with a non-volatile memory, comprising:
   instructions for receiving a noisy codeword that is based on a transmitted codeword generated from an irregular quasi-cyclic low-density parity-check (QC-LDPC) code;
   instructions for performing a plurality of decoding iterations on the received noisy codeword, each of the plurality of decoding iterations comprising a processing of N circulant matrices;
   instructions for performing, before processing a current circulant matrix in a current M-th iteration of the plurality of decoding iterations, operations that include:
      computing a number of bit flips ($n_w$) that have occurred over the processing of N previous circulant matrices, the N previous circulant matrices spanning the current M-th iteration and an (M−1)-th iteration, wherein M and N are positive integers, and wherein M≥2, and
      updating, based on the number of bit flips, a bit-flipping threshold; and
   instructions for processing, based on the updated bit-flipping threshold, the current circulant matrix.

16. The storage medium of claim 15, further comprising:
   instructions for computing a syndrome; and
   instructions for refraining from performing a subsequent iteration of the bit-flipping decoder upon a determination that a maximum number of iterations has been performed or that the syndrome is equal to zero.

17. The storage medium of claim 15, wherein each of the plurality of decoding iterations comprises passing one or more messages between a plurality of variable nodes and a plurality of check nodes that represent a parity check matrix of the irregular QC-LDPC code.

18. The storage medium of claim 17, further comprising:
   instructions for concurrently computing, for each of the plurality of decoding iterations, a flipping energy for each of the plurality of variable nodes in the current circulant matrix.

19. The storage medium of claim 15, wherein computing the number of bit flips in an i-th iteration and prior to processing a (j+1)-th circulant matrix (denoted $n_w^{(i)}(j+1)$) uses a first-in first-out (FIFO) queue of depth N.

20. The storage medium of claim 19, wherein $n_w^{(i)}(j+1)$ is determined as:

$$n_w^{(i)}(j+1) = n_w^{(i)}(j) - n_j^{(i-1)} + n_j^{(i)}$$

wherein $n_j^{(i)}$ is the number of bit flips in a j-th circulant matrix in the i-th iteration and $n_j^{(i-1)}$ is the number of bit flips in the j-th circulant matrix in an (i−1)-th iteration, wherein $n_w^{(i)}(j)$ is the number of bit flips in the i-th iteration prior to processing the j-th circulant matrix, and wherein i and j are positive integers.

* * * * *